(12) United States Patent
Chan et al.

(10) Patent No.: US 9,418,846 B1
(45) Date of Patent: Aug. 16, 2016

(54) SELECTIVE DOPANT JUNCTION FOR A GROUP III-V SEMICONDUCTOR DEVICE

(71) Applicant: International Business Machines Corporation, Armonk, NY (US)

(72) Inventors: Kevin K. Chan, Staten Island, NY (US); Marinus J. P. Hopstaken, Carmel, NY (US); Young-Hee Kim, Mohegan Lake, NY (US); Masaharu Kobayashi, Tokyo (JP); Effendi Leobandung, Stormville, NY (US); Deborah A. Neumayer, Danbury, CT (US); Dae-Gyu Park, Poughquag, NY (US); Uzma Rana, Chappaqua, NY (US); Tsong-Lin Tai, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/634,050

(22) Filed: Feb. 27, 2015

(51) Int. Cl.
*H01L 21/02* (2006.01)
*H01L 29/207* (2006.01)
*H01L 21/225* (2006.01)

(52) U.S. Cl.
CPC .... *H01L 21/02658* (2013.01); *H01L 21/02392* (2013.01); *H01L 21/02395* (2013.01); *H01L 21/2258* (2013.01); *H01L 29/207* (2013.01)

(58) Field of Classification Search
CPC .............. H01L 21/02658; H01L 21/02395; H01L 21/2258; H01L 21/02392
USPC ........................................ 257/609
See application file for complete search history.

(56) References Cited

U.S. PATENT DOCUMENTS

| | | | |
|---|---|---|---|
| 5,086,321 A | 2/1992 | Batey et al. | |
| 5,296,394 A | 3/1994 | Shim et al. | |
| 5,432,126 A | 7/1995 | Oikawa | |
| 6,593,603 B1 | 7/2003 | Kim et al. | |
| 6,890,776 B2 | 5/2005 | Okajima | |
| 8,415,772 B2 | 4/2013 | de Souza et al. | |
| 2004/0159335 A1* | 8/2004 | Montierth | B08B 3/08 134/10 |
| 2006/0060132 A1 | 3/2006 | Hata | |
| 2007/0099435 A1* | 5/2007 | Sugawara | C23C 8/02 438/770 |
| 2013/0285155 A1* | 10/2013 | Glass | H01L 29/0847 257/369 |
| 2014/0065819 A1* | 3/2014 | Ahmed | H01L 21/2255 438/664 |
| 2014/0273398 A1* | 9/2014 | Holland | H01L 21/76 438/400 |

FOREIGN PATENT DOCUMENTS

WO    WO 9706555 A1 *    2/1997    ........ H01L 21/02052

* cited by examiner

*Primary Examiner* — Christine Enad
(74) *Attorney, Agent, or Firm* — Maeve Carpenter (57) ABSTRACT

An approach to providing a method of forming a dopant junction in a semiconductor device. The approach includes performing a surface modification treatment on an exposed surface of a semiconductor layer and depositing a dopant material on the exposed surface of the semiconductor layer. Additionally, the approach includes performing a low temperature anneal in an oxygen free environment followed by depositing a metal layer on the dopant layer. Furthermore, the approach includes alloying the metal layer with the dopant layer to form a semiconductor device junction where the semiconductor layer is composed of a Group III-V semiconductor material, the surface modification treatment occurs in a vacuum chamber to remove surface oxides from the exposed surface of the semiconductor layer, and each of the above processes occur at a low temperature.

16 Claims, 6 Drawing Sheets

SELECTIVE DOPANT JUNCTION FOR A GROUP III-V SEMICONDUCTOR DEVICE

BACKGROUND OF THE INVENTION

The present invention relates generally to the field of semiconductor technology, and more particularly to the formation of a selective in-situ dopant junction for III-V semiconductor device.

Semiconductor device scaling to smaller feature sizes is facing significant challenges. Traditional semiconductor materials and processes for device formation become less effective as physical dimensions shrink down to the nanometer range. Increasing use of low effective mass semiconductor materials provides an increase in the maximum obtainable velocity of charge carriers such as electrons and holes. The effective mass is the mass an electron or a hole appears to have when in a solid material. The effective mass of electrons and holes in semiconducting materials, in general, is lower than the mass of a free electron.

Group III-V semiconductor materials provide smaller effective mass than Group IV semiconductor materials and are thus, desirable for increasing performance due to a corresponding increase in electron velocity associated with lower effective mass. Group IV and Group III-V refers to the location of the semiconductor element in a column of the Periodic Table of Elements. A group of semiconductor elements generally share similar characteristics, for example, similar physical and electrical characteristics of the outermost shell of electrons. A Group III-V semiconductor is a semiconductor material that includes at least one element or semiconductor material from Group III and at least one element or semiconductor material from Group V of the Periodic Table of Elements. Group III-V semiconductor materials see increasing use in high performance semiconductor devices, particularly, in the nanometer range.

SUMMARY

Embodiments of the present invention provide a method of forming a junction in a semiconductor device. The method includes performing a surface modification treatment on an exposed surface of a semiconductor layer and depositing a dopant material on the exposed surface of the semiconductor layer. Additionally, the method includes performing a low temperature anneal in an oxygen free environment followed by depositing a metal layer on the dopant layer. Furthermore, the method includes alloying the metal layer with the dopant layer to form a semiconductor device junction where the semiconductor layer is composed of a Group III-V semiconductor material, the surface modification treatment occurs in a vacuum chamber to remove surface oxides from the exposed surface of the semiconductor layer, and each of the above processes occur at a low temperature.

Embodiments of the present invention provide a semiconductor structure with a selective dopant junction in a semiconductor device. The semiconductor structure includes a Group III-V semiconductor layer and a region in the Group III-V semiconductor layer with a dopant material forming the dopant junction. Additionally, the semiconductor structure includes an alloy layer composed of a metal and the dopant material over the region in the Group III-V semiconductor layer with the dopant material.

DETAILED DESCRIPTION

Detailed embodiments of the claimed structures and methods are disclosed herein. The method steps described below do not form a complete process flow for manufacturing integrated circuits. The present embodiments can be practiced in conjunction with the integrated circuit fabrication techniques currently used in the art, and only so much of the commonly practiced process steps are included as are necessary for an understanding of the described embodiments. The Figures represent cross-section portions of a semiconductor chip or a semiconductor wafer during fabrication and are not drawn to scale, but instead are drawn to illustrate the features of the described embodiments. Specific structural and functional details disclosed herein are not to be interpreted as limiting, but merely as a representative basis for teaching one skilled in the art to variously employ the methods and structures of the present disclosure. In the description, details of well-known features and techniques may be omitted to avoid unnecessarily obscuring the presented embodiments.

References in the specification to "one embodiment", "other embodiment", "another embodiment", "an embodiment", etc., indicate that the embodiment described may include a particular feature, structure or characteristic, but every embodiment may not necessarily include the particular feature, structure or characteristic. Moreover, such phrases are not necessarily referring to the same embodiment. Further, when a particular feature, structure, or characteristic is described in connection with an embodiment, it is understood that it is within the knowledge of one skilled in the art to affect such feature, structure or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "over", "on", "positioned on" or "positioned atop" mean that a first element is present on a second element wherein intervening elements, such as an interface structure, may be present between the first element and the second element. The term "direct contact" means that a first element and a second element are connected without any intermediary conducting, insulating or semiconductor layers at the interface of the two elements.

In the interest of not obscuring the presentation of the embodiments of the present invention, in the following detailed description, some of the processing steps or operations that are known in the art may have been combined together for presentation and for illustration purposes and in some instances may not have been described in detail. In other instances, some processing steps or operations that are known may not be mentioned at all. It should be understood that the following description is focused on the distinctive features or elements of the various embodiments of the present invention.

New device engineering is indispensable in overcoming difficulties of complementary metal-oxide semiconductor (CMOS) devices and advanced metal-oxide semiconductor field effect transistors (MOSFETs) to realize high performance large scale integrations under, for example, the 10 nm gate-length range. In addition to the improvements of gate stacks using metal gate and/or high-k gate dielectrics, new channel materials with enhanced carrier transport properties are needed for enhancing the performance of MOSFET circuits and chips. Embodiments of the present invention, recognize that n-channel field effect transistors (nFETs) with Group III-V semiconductor channels are considered a compelling candidate for extending the device scaling limits of low-power and high-speed circuit operation, owing to their enhanced carrier transport properties compared to those of silicon (Si).

Embodiments of the present invention recognize decomposition of Group III-V semiconductor materials has been observed at high temperatures. At temperatures above 650° Celsius, the decomposition of compound Group III-V semiconductors into individual elements such as In, Ga or As may occur. The decomposition of a Group III-V semiconductor material results in semiconductor material and property changes. The material changes may include the loss of some of the original semiconductor material electrical properties. In some cases, after high temperature exposure, a reduction in electron mobility in some Group III-V semiconductor materials has been noted. Traditional semiconductor device processing on Group III-V semiconductor material implants or deposits dopant materials outside the gate and activates the source and drain junction using high temperature processes which may cause decomposition of the channel composed of Group III-V semiconductor materials and, subsequent reduction in electron mobility.

Additionally, embodiments of the present invention recognize that in conventional semiconductor device processing of silicon wafers a wet chemical etch such as HF or HCL etch is used for surface oxide removal prior to dopant or other material deposition to provide a clean, oxide free surface. Hydrogen termination with the formation of H—Si retards the regrowth of oxides on silicon wafer surfaces for a short period of time (e.g., ten to twenty minutes). However, Group III-V semiconductor materials such as InGaAs have no termination function or bonds and, therefore surface oxides quickly reform after wet chemical oxide etch in the presence of oxygen. Surface oxides reduce surface adhesion and electrical conductivity in a semiconductor device.

Embodiments of the present invention include structures and methods to form and activate junctions such as source or drain junctions in Group III-V semiconductor devices using low temperature processes. A surface modification treatment removing oxides present on the Group III-V semiconductor surface in the source and drain junction area provides a clean, oxide-free surface for material adhesion such as a dopant layer. The removal of surface oxides provides a clean surface for dopant material adhesion and a low resistance electrical path into the source and drain regions, uninhibited by oxides which cause a higher electrical resistance.

Embodiments of the present invention provide low temperature processes utilizing temperatures equal to or less than 650° Celsius to form an in-situ selectively grown dopant layer driven into the Group III-V semiconductor with a low temperature anneal process in an oxygen free environment. Furthermore, the deposition of a thin metal layer and a low temperature alloying process forms a metallic alloy or a silicide combines or alloys the metal layer with the dopant layer to create an activated low resistance junction for semiconductor device formation.

Figure 1:
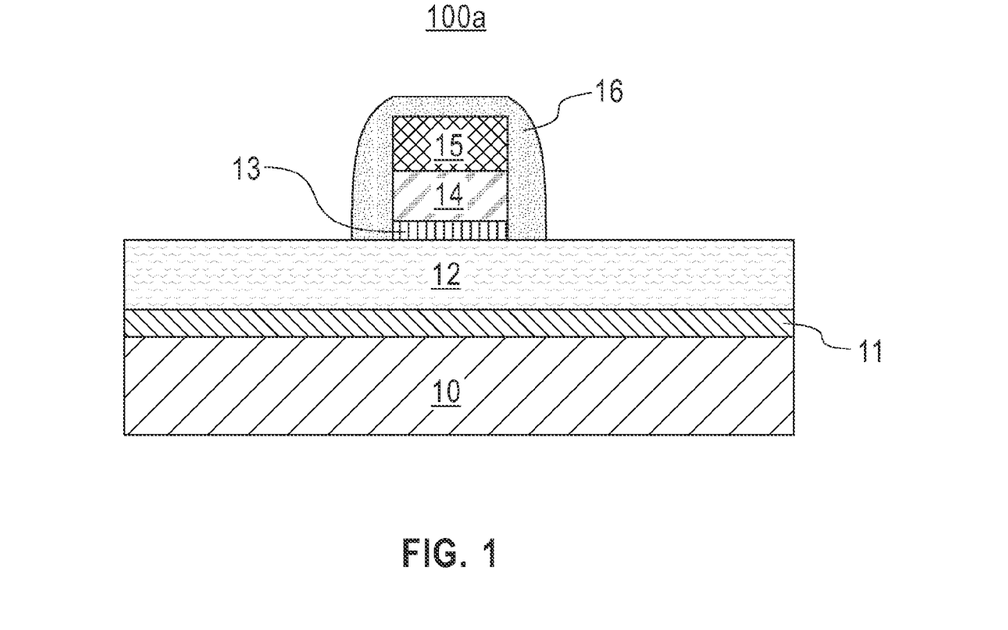
FIG. 1 depicts a cross-sectional view of a semiconductor structure, in accordance with an embodiment of the present invention.

The present invention will now be discussed with reference to the Figures. FIG. 1 depicts a cross-sectional view of a semiconductor structure 100$a$ in accordance with an embodiment of the present invention. As depicted, FIG. 1 includes substrate 10, insulator layer 11, semiconductor layer 12, gate dielectric 13, gate material 14, hard mask 15, and spacer 16. Gate dielectric 13, gate material 14, and hard mask 15 form a gate stack for the semiconductor device.

Substrate 10 is a semiconductor substrate. In various embodiments, substrate 10 is a single crystal silicon substrate. Substrate 10 may be composed of a low defect density semiconductor material which may be a single crystal, an amorphous, or a polycrystalline semiconductor. Substrate 10 may be doped, undoped, or contain doped or undoped regions. Substrate 10 may be strained, unstrained or a combination thereof. In another embodiment, substrate 10 may be composed of any suitable semiconductor material compatible with silicon on insulator (SOI) processes. In an embodiment, substrate 10 is composed of any suitable semiconductor material. For example, substrate 10 may be SiGe, Ge, GaAs, InP, any suitable Group IV semiconductor, any suitable compound Group IV semiconductor material, any suitable Group IV, Group III-V or Group II-VI semiconductor material. In another embodiment, substrate 10 is a non-conductive material such as oxide, nitride, or ceramic. In another embodiment, substrate 10 is composed of a conductive material such as aluminum, copper or other metal. In some embodiments, substrate 10 may not be present.

Insulator layer 11 is a non-conductive oxide insulating layer over substrate 10. In an embodiment, insulator layer 11 is a buried insulating layer (BOX) in an SOI wafer. For example, insulator layer 11 which is a BOX may be composed of silicon dioxide or other SOI BOX material suitable for use with a Group III-V semiconductor. In another embodiment, insulator layer 11 is composed of an insulator suitable for a Group III-V semiconductor material. For example, insulator layer 11 may be composed of InAlAs, SiN, another nitride material, an oxide material or any other appropriate insulating material for Group III-V semiconductor materials.

In the exemplary embodiment, semiconductor layer 12 is Group III-V semiconductor material. For example, semiconductor layer 12 may be composed of InGaAs, GaAs, InP, InAs, InGaAsP, InAlAsSb, or another Group III-V semiconductor material. In the exemplary embodiment, semiconductor layer 12 is intrinsic or undoped. In an embodiment, semiconductor 12 has one or more doped regions present (not shown). In various embodiments, semiconductor layer 12 may be a part of a layered semiconductor substrate such as a semiconductor on insulator substrate (SOI). In another embodiment, semiconductor layer 12 may be grown or deposited on another semiconductor material layer of the same composition or a semiconductor material of another composition. In one embodiment, semiconductor layer 12 is a stand-alone semiconductor layer without insulator layer 11 or substrate 10. Semiconductor layer 12 may be strained, unstrained or a combination thereof. Semiconductor layer 12 may also consist of two materials with different lattice constants, in which case the upper portion of the substrate is grown thick such that the upper portion has a low density of defects (this is often called "virtual" substrate) and therefore, the upper portion is of device quality, that is, a quality level capable of use in fabricating semiconductor devices and circuits Gate dielectric 13 is composed of a dielectric material. In the exemplary embodiment, gate dielectric 13 is composed of a high-k dielectric material. For example, gate dielectric 13 may be composed of a high-k material such as, but not limited to, $HfO_2$, $ZrO_2$, $TiO_2$, $Al_2O_3$, $La_2O_3$, $Y_2O_3$, $LaAlO_3$, $HfSiO_2$, and $SrTiO_3$. Gate dielectric 13 may be deposited with known techniques including, but not limited to chemical vapor deposition (CVD), plasma enhanced chemical vapor deposition (PECVD), atomic layer deposition (ALD), physical vapor deposition (PVD), or other similar deposition processes. In one embodiment, gate dielectric 13 is composed of any material suitable for forming a gate dielectric. For example, $SiO_2$ may be used for gate dielectric 13.

Gate material 14 may be any material suitable for forming a gate electrode. In various embodiments, gate material 14 is composed of titanium nitride. In an embodiment, gate material 14 is composed of any suitable gate material. For example, gate material may be one of the following metals: tungsten, tantalum, tantalum nitride, platinum, or gold. Gate material 14 may be deposited with known deposition methods such as molecular beam epitaxy (MBE), CVD, PECVD, atomic layer deposition (ALD), PVD or other similar deposition methods. In another embodiment, gate material 14 is another conductive material, for example, polysilicon, polysilicon germanium, polygermanium, conductive metal alloys, conductive nitrides, conductive oxides, and similar conductive materials or combination of conductive materials or layers. In some embodiments, gate material 14 consists of polysilicon, polysilicon germanium, or polygermanium doped with doping materials such as aluminum, boron, arsenic, phosphorous, antimony, gallium, or mixtures thereof.

Hard mask 15 is a dielectric layer. Hard mask layer 15 is deposited by known deposition methods including but, not limited to CVD, ALD, PECVD or thermal oxidation. Hard mask 15 may be composed of oxides, oxinitride, or nitrides such as SiN or any suitable hard mask material. In one embodiment, hard mask 15 may not be present.

Spacer 16 is a dielectric material. In various embodiments, spacer 16 may be composed of suitable spacer materials for use with Group III-V semiconductor devices. For example, spacer 16 may be composed of an oxide, oxide nitride, or boron nitride. Spacer 16 may be deposited with known deposition processes including, but not limited to ALD, CVD, or PECVD. Spacer 16 may be selectively etched by reactive ion etch (RIE), a chemical etch process or other suitable material removal process. In one embodiment, spacer 16 is not present on the top of hard mask 15.

Figure 2:
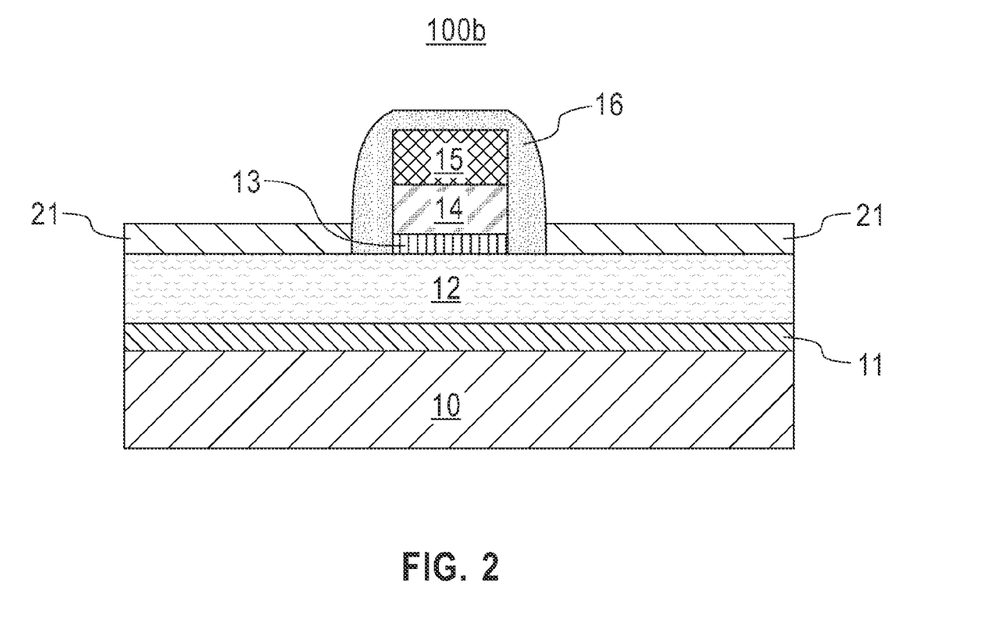
FIG. 2 depicts a cross-sectional view of the semiconductor structure after a surface modification treatment and a selective deposition of a dopant layer, in accordance with an embodiment of the present invention.

FIG. 2 depicts a cross-sectional view of the semiconductor structure 100b after a surface modification treatment and a selective dopant deposition in accordance with an embodiment of the present invention. As depicted, FIG. 2 includes the elements of FIG. 1 and dopant layer 21. The surface modification treatment removes oxides on the exposed surface of the surface of semiconductor layer 12. In an embodiment, a surface oxidation removal by wet chemistry such as HCl or HF solution is done prior to the surface modification treatment. In the exemplary embodiment, semiconductor layer 12 receives the surface modification treatment to remove the layer of surface oxides present on the exposed regions of the surface of semiconductor layer 12. For example, semiconductor layer 12 composed of InGaAs may have a thin layer of oxides present on the exposed surfaces of semiconductor layer 12. An in-situ surface desorption of oxygen (e.g., oxides) on the exposed portion of the surface of semiconductor layer 12 occurs using a vacuum desorption process with an ultra-low pressure vacuum chamber. In the ultra-low pressure vacuum chamber, a low velocity stream of gaseous hydrogen is applied to the exposed portions of the surface of semiconductor layer 12 to remove surface oxides which may be present. Desorption of oxides occurs where oxygen is desorbed from semiconductor layer 12 surface forming water vapor when the gaseous hydrogen is blown on the exposed surface oxide in a low pressure environment. Surface oxides prevent or reduce surface adhesion of materials such as an in-situ deposited dopant material to the surface of semiconductor layer 12. Additionally, oxides that have a lower electrical resistance inhibit or slow electron paths thus, creating a slight increase in electrical resistance of the oxide region.

After the surface modification treatment is complete, the surface of semiconductor layer 12 may be free of oxides and ready for the selective dopant deposition, for example, a selective, low temperature epitaxial growth of solid source dopants depicted as dopant layer 21 in FIG. 2. Dopant layer 21 is selectively grown using an in-situ solid-phase epitaxial growth process on the exposed surface of semiconductor layer 12. In the exemplary embodiment, dopant layer 21 is composed of silicon. For example, with semiconductor layer 12 composed of Group III-IV material such as InGaAs, Si may be selectively grown by in-situ epitaxy to form a dopant for a source or drain in a nFET type semiconductor device. In another embodiment, dopant layer 21 is composed of suitable doping material that may be used in an nFET for a Group III-V semiconductor material. For example, one or more of: Ge, SiGe, GeSn, Sn, SiC, SiGeC, GeC, InP or another n-type doping material for a Group III-V semiconductor material may be used in dopant layer 21. Dopants such as an n-type dopant may be used for device element formation such as a source, a drain or other similar device element in a semiconductor device. In the exemplary embodiment, the thickness of dopant layer 21 is 0.1 nm to 10 nm. In one embodiment, a thick layer (e.g., greater than 10 nm thick) of amorphous silicon or other suitable dopant material is deposited on semiconductor layer 12 to form a raised source and/or a raised drain. The deposited amorphous silicon or other Group III-V dopant material may be planarized using a chemical-mechanical polish process. A reactive ion etch may be used to thin the amorphous silicon layer or other dopant material for the raised source and/or drain formation.

Figure 3:
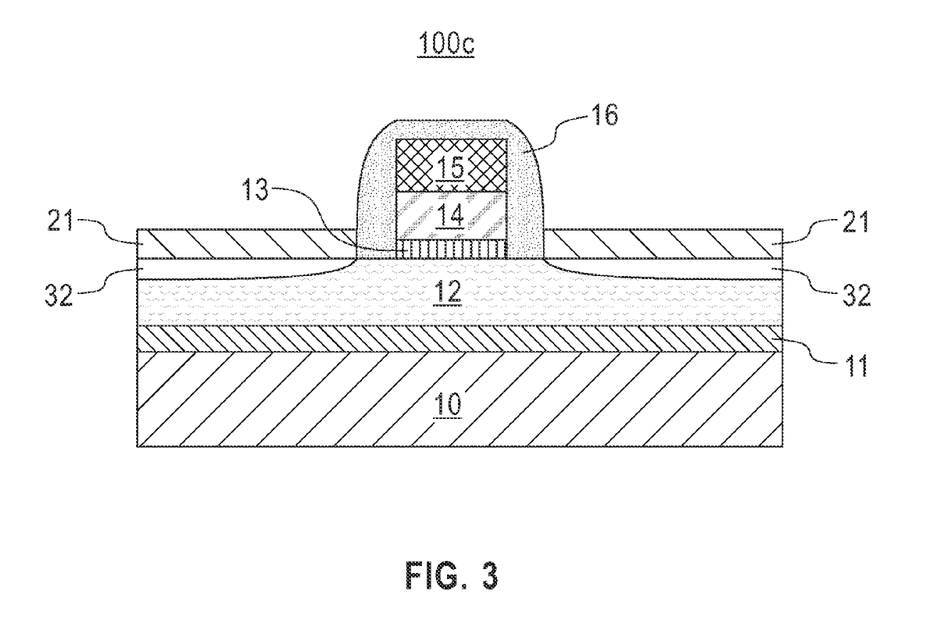
FIG. 3 depicts a cross-sectional view of the semiconductor structure after performing a low temperature anneal, in accordance with an embodiment of the present invention.

FIG. 3 depicts a cross-sectional view of the semiconductor structure 100c after performing a low temperature anneal in accordance with an embodiment of the present invention. As depicted, FIG. 3 includes the elements of FIG. 2 and a region (e.g., region 32) in which the dopant material of dopant layer 21 has been diffused or driven into the upper surface of semiconductor layer 12 using a low temperature anneal process. In the exemplary embodiment, the low temperature anneal is done in an oxygen free environment. For example, the low temperature anneal may be done in a hydrogen plasma. Region 32 is the region of semiconductor layer 12 in which the dopant of dopant layer 21 has diffused into semiconductor layer 12 (e.g., the region composed of the semiconductor material of semiconductor layer 12 with the dopant present). For example, region 32 may be composed of InGaAs with a Si dopant. The concentration of Si dopant in region 32 may be approximately 1e$^{19}$ atoms/cm$^3$ or more, for example.

Figure 4:
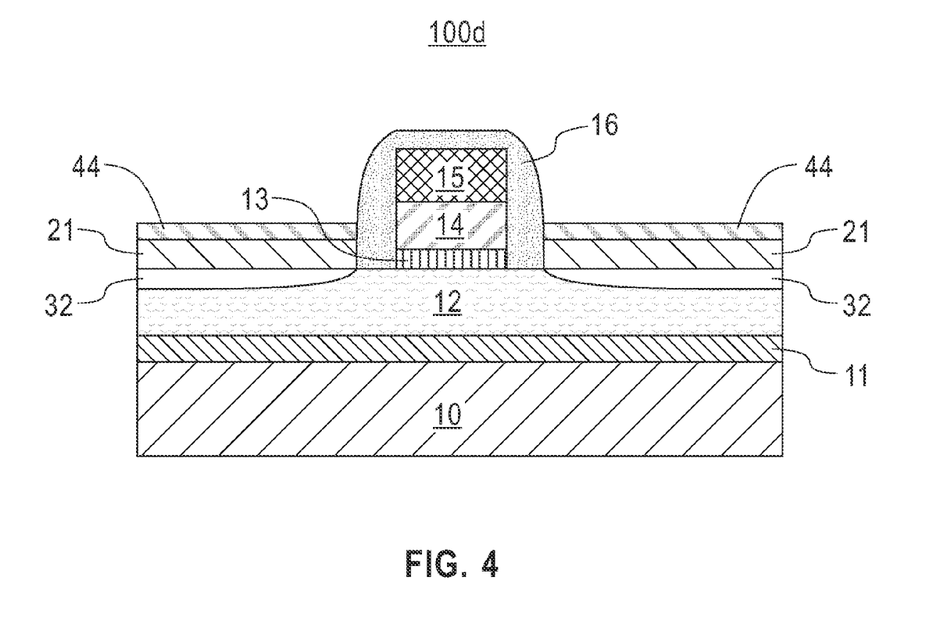
FIG. 4 depicts a cross-sectional view of the semiconductor structure after fabrication steps to form a metal layer in accordance with an embodiment of the present invention.

FIG. 4 depicts a cross-sectional view of the semiconductor structure 100d after fabrication steps to form a thin metal layer in accordance with an embodiment of the present invention. As depicted FIG. 4 includes the elements of FIG. 3 and metal layer 44. Using known industry standard processes such as sputtering of a metal or a silicide material, metal layer 44 may be formed on dopant layer 21. In the exemplary embodiment, metal layer 44 is composed of Ni. In an embodiment, metal layer 44 may be a transition metal. In an embodiment, another material such as Ti, Co, NiPt, Pd, Au, Mo, Sn or similar material suitable for deposition and alloying with dopant layer 21 may be used. In an embodiment, metal layer 44 may be any material suitable for silicide or metallic alloy formation. In one embodiment, more than one material may be used for metal layer 44. In some embodiments, the thickness range of material deposited for metal layer 44 is 1 nm to 50 nm. In other embodiments, the thickness range of metal layer 44 is determined by the dopant material and dopant layer 21 thickness. As one skilled in the art will appreciate, a range of thickness of metal layer 44 may be determined by the metal layer 44 material, dopant layer 21 material and thickness, and temperature/time of an alloying process for a silicide formation or alloy process consuming dopant layer 21.

Figure 5:
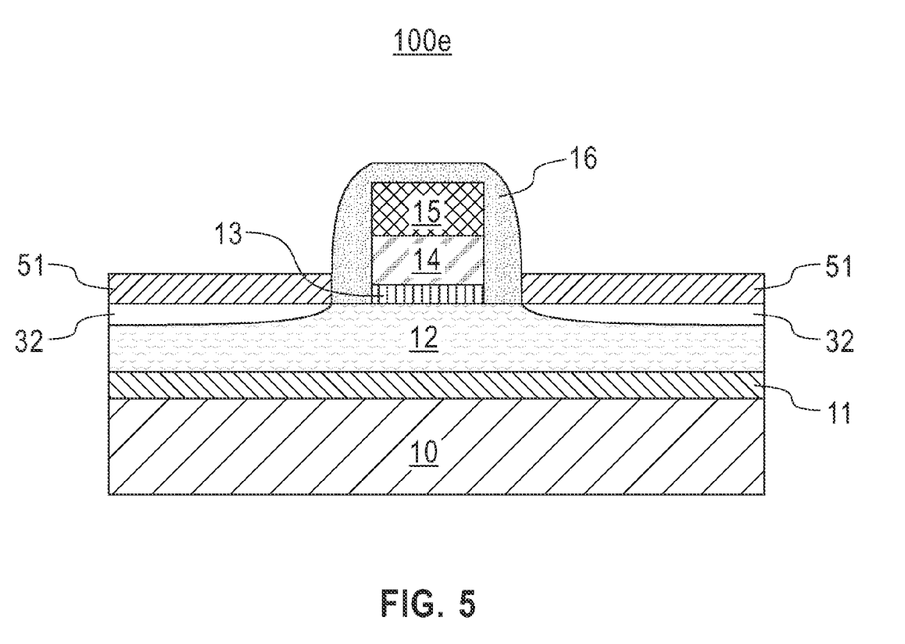
FIG. 5 depicts a cross-sectional view of the semiconductor structure after fabrication steps to form an alloying layer, in accordance with an embodiment of the present invention.

FIG. 5 depicts a cross-sectional view of the semiconductor structure 100e after fabrication steps to form an alloying layer in accordance with an embodiment of the present invention. As depicted, FIG. 5 includes the elements of FIG. 4 except metal layer 44 and dopant layer 21, which have been transformed into alloy layer 51. In the exemplary embodiment, using a low temperature anneal process, metal alloy layer 44 combines with or alloys with the dopant material in dopant layer 21 to form alloy layer 51. For example, alloy layer 51 may be composed of Ni and Si. Alloy layer 51 may be composed of Ni and Si when metal layer 44 composed of Ni is alloyed in a low temperature annealing process with dopant layer 21 composed of Si. In the exemplary embodiment, the dopant material of dopant layer 21 which is not diffused in region 32 is consumed or utilized in alloy layer 51. In one embodiment, metal layer 44 is consumed or used up in the formation of alloy layer 51. In an embodiment, a portion of metal layer 44 remains on alloy layer 51. In another example, metal layer 44 alloys with dopant layer 21 composed of any n-type dopant material suitable for use in a Group III-V semiconductor material. For example, Ge, SiGe, GeSn, Sn, SiC, SiGeC, GeC, InP or another n-type doping material for a Group III-V semiconductor material may be used as a dopant material. In an additional embodiment, metal layer 44 is composed of more than one layer. For example, two layers of metal layer 44 may be deposited composed of two different materials.

Metal contacts for device interconnections and back-end-of-line wiring interconnect layers may be formed on top of alloy layer 51. Metal contacts such as Ta, W, Cu, TiN, and similar contact materials may be formed using known industry processes.

In the exemplary embodiment, the semiconductor structure 100e depicts a complementary metal-oxide-semiconductor (CMOS) device with a source (e.g., alloy layer 51 and region 32), a drain (e.g., alloy layer 51 and region 32), a gate composed of gate dielectric 13, gate material 14, hard mask 15, spacer 16, and a channel (not shown) formed in a portion of semiconductor layer 12. In an embodiment, a raised source and/or a raised drain is formed as a part of the semiconductor device. While FIGS. 1 to 5 depict the formation of a field-effect transistor (FET) in a CMOS device, the embodiments of the present invention are not limited to the embodiments depicted. In some embodiments, another semiconductor structure is formed. For example, a finFET, a vertical FET, a tunneling FET or metal-oxide FET (MOSFET), or other device structure may be formed. The methods and processes discussed in reference to the Figures may be used to form other types of semiconductor devices. For example, the method and processes discussed may be used in the formation of a vertical FET, an optical device, or other semiconductor device utilizing a Group III-V semiconductor material.

Figure 6:
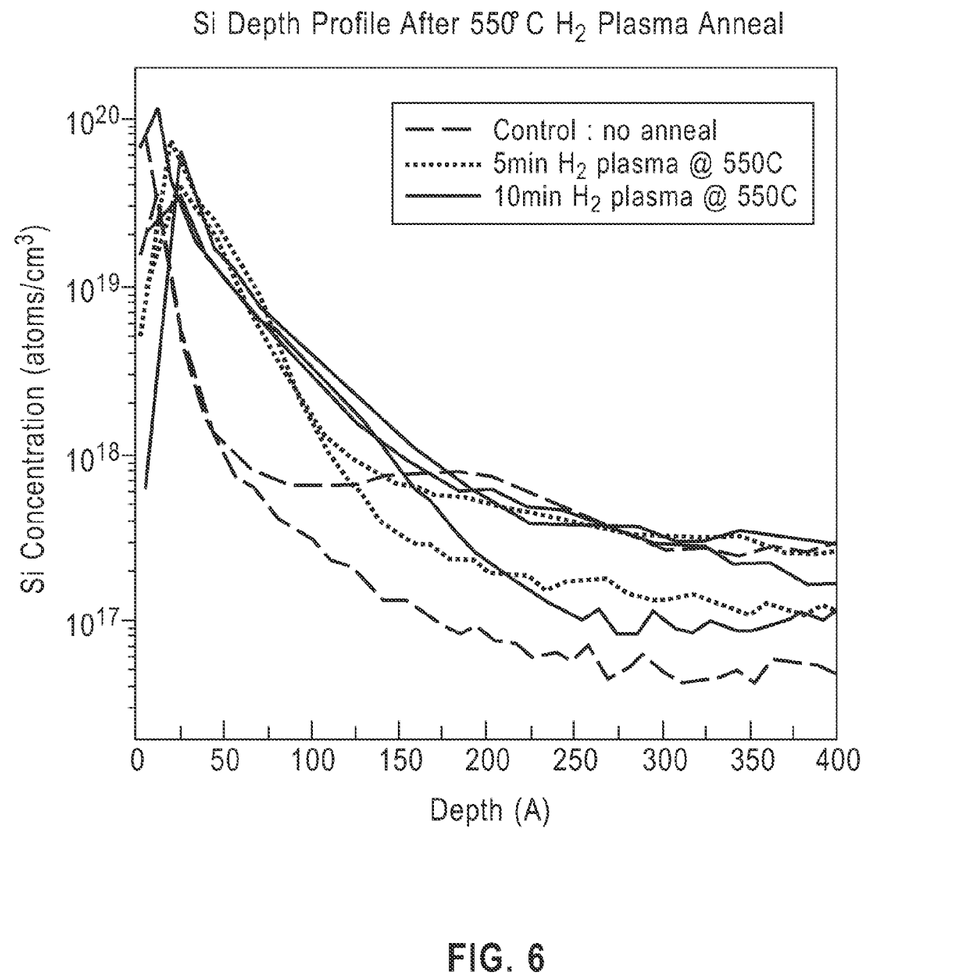
FIG. 6 depicts an Si depth profile after a 550° Celsius hydrogen plasma anneal, in accordance with an embodiment of the present invention.

FIG. 6 depicts a Si depth profile after 550° Celsius hydrogen plasma anneal in accordance with an embodiment of the present invention. The Si depth profile is performed on InGaAs samples with a surface modification treatment. The lines represent data on Si depth associated with one of the following treatments: dopant layer 21 composed of Si with a five minute low temperature anneal at 550° Celsius in H$_2$ plasma, a ten minute low temperature anneal at 550° Celsius in H$_2$ plasma and a control sample prepared without any low temperature anneal (shown in FIG. 7). The horizontal axis depicts the depth of Si penetration in angstroms. The vertical axis is the silicon concentration in atoms per centimeter cube. The device requirements for electrical performance (e.g., a desired electrical resistance) require a silicon concentration of 1e10$^{19}$ atoms/cm$^3$. At this concentration, the samples with a five and a ten minute low temperature anneal had better Si penetration or depth than control samples without a low temperature anneal. Low temperature anneal samples provided a Si depth about 75 to 85 angstroms at the desired silicon concentration (e.g., 10$^{19}$ atoms/cm$^3$) as compared to a Si depth of about 25 angstroms on control samples. The increased depth of dopant penetration reduces the resistance of the interface of the low temperature annealed samples due to better dopant (e.g., Si) depth penetration with low temperature anneal in H$_2$ plasma compared to control samples. Furthermore, electrical contact resistance of InGaAs samples made with Si dopants formed using the methods of FIGS. 1-5 (e.g. surface modification treatment, selective doping, low temperature anneal and alloying) using transmission line measurement methods resulted in a low contact resistance. Contact resistance in the range of 4.16e$^{-6}$ was obtained.

Figure 7:
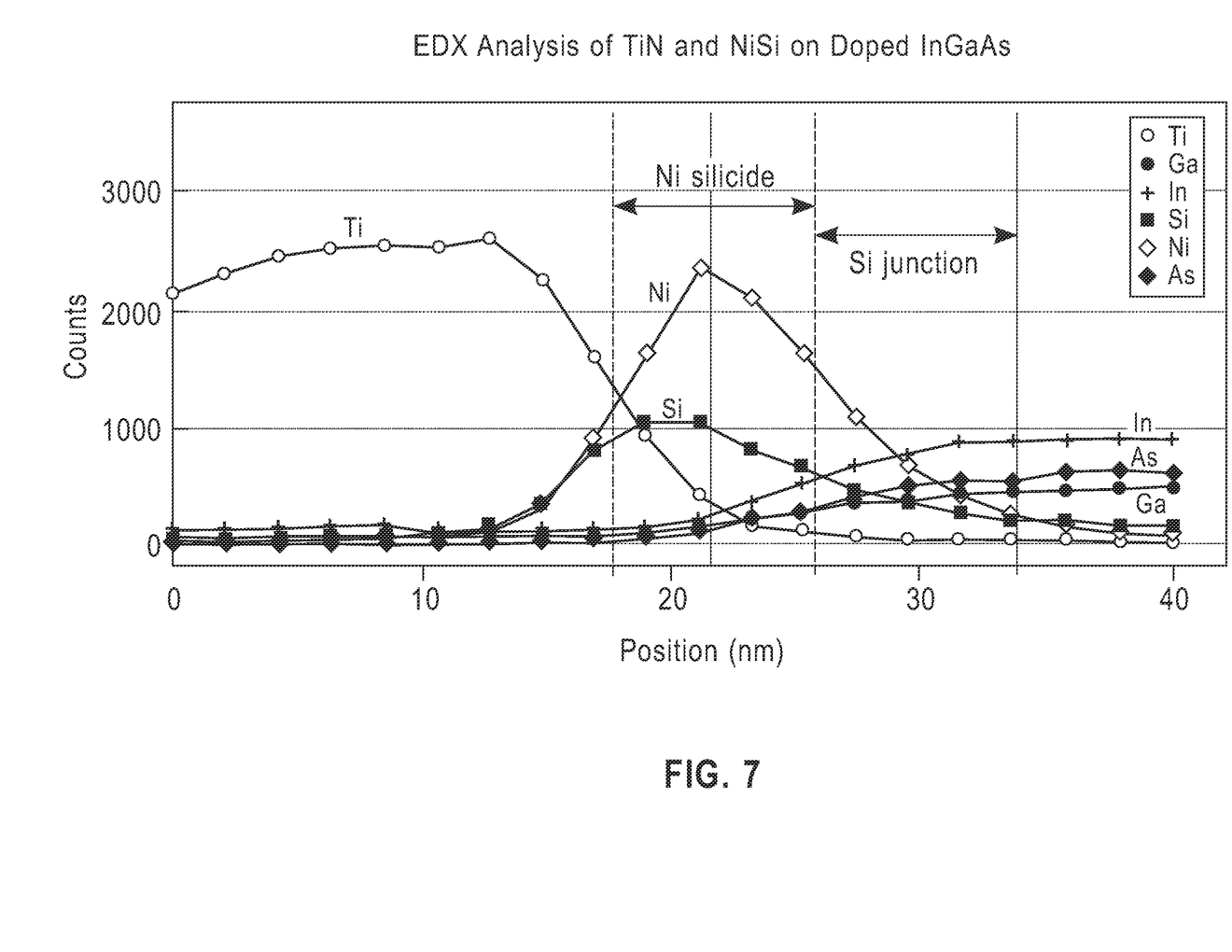
FIG. 7 depicts an energy dispersive x-ray analysis of a Group III-V semiconductor sample processed according to FIGS. 1-5, and as discussed with reference to FIG. 8, in accordance with an embodiment of the present invention.
Figure 8:
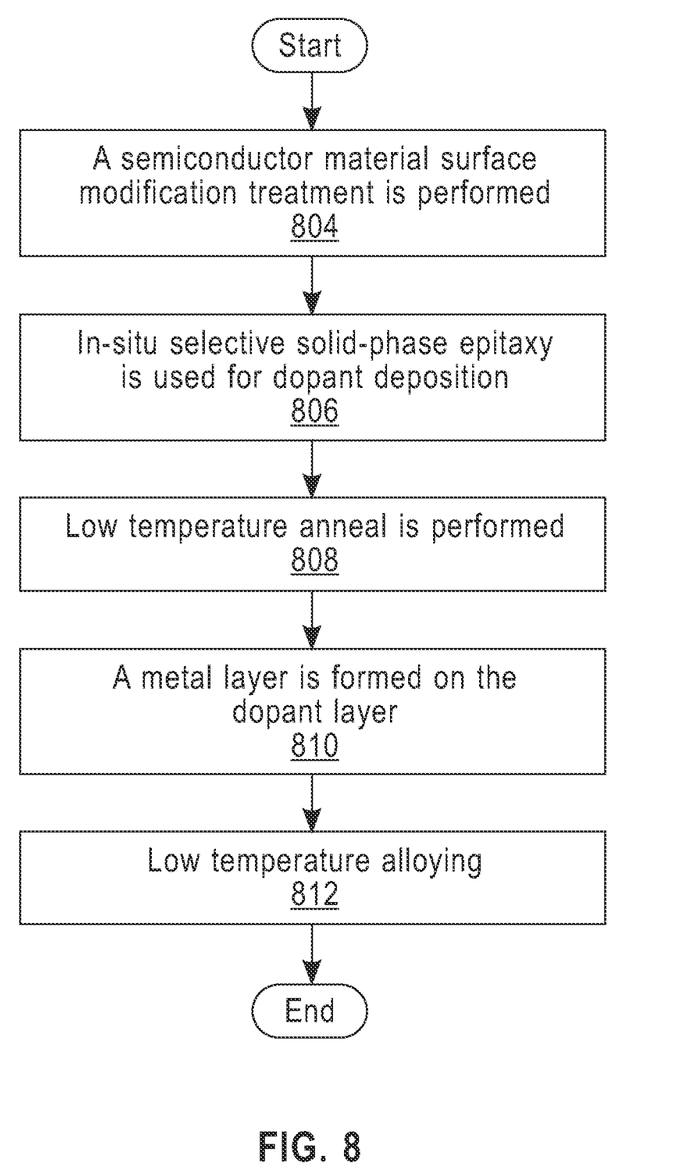
FIG. 8 illustrates a process flow for creating the semiconductor structure as depicted in FIG. 5, in accordance with an embodiment of the present invention.

FIG. 7 depicts an energy dispersive x-ray analysis (EDX) of a Group III-V semiconductor sample processed according to FIGS. 1-5, and as discussed in FIG. 8 in accordance with an embodiment of the present invention. The EDX of an InGaAs semiconductor layer processed according to the steps discussed in FIGS. 1-5, and according to the process flow depicted in FIG. 8 using Si as a dopant material (e.g., dopant layer 21 in FIG. 2) is depicted. The EDX from the top of the sample (e.g., 0 nm position) shows the TiN (nitrogen not shown as not measured in EDX) layer as a cap or top layer deposited over a Ni silicide which is a NiSi alloy layer (e.g., alloy layer 51) after a ten minute low temperature anneal. The vertical axis indicates counts of the respective elements as analyzed. The horizontal axis indicates a position in a cross-section of the semiconductor sample for the resulting element counts. The EDX analysis illustrates that Si in the Si junction or dopant layer 21 diffuses into the InGaAs semiconductor (e.g., semiconductor layer 12) at position 35 nm and then, forms a Si junction (e.g., region 32 in FIG. 5) with dopant Si between positions 25 nm and 35 nm. A Ni silicide (e.g., alloy layer 51) is depicted in positions 18 nm to 25 nm where Ni and Si alloy or combine. In addition, other alloys such as Ni—Ga, Ni—As, and Ni—In may occur in the Si junction (e.g., region 32) as depicted in positions 25 nm to 35 nm.

FIG. 8 illustrates a process flow for creating the semiconductor structure 100e as depicted in FIG. 5, in accordance with an embodiment of the present invention.

In step 804, a semiconductor material surface modification treatment is performed on a semiconductor structure. The semiconductor structure includes a semiconductor layer 12 composed of a Group III-V semiconductor material such as InGaAs or GaAs with a portion of the top surface exposed (e.g., semiconductor structure 100a in FIG. 1). The Group III-V semiconductor (e.g., semiconductor layer 12) is placed in a vacuum pressure chamber for an oxide desorption process. In the exemplary embodiment, the pressure in the vacuum chamber may be in the range of $10^{-7}$ to $10^{-10}$ TORR however, vacuum chamber pressure is not limited to this range in other embodiments. A stream of $H_2$ gas is blown on the semiconductor surface in the vacuum chamber for oxygen desorption of the surface oxides. The velocity of the stream of hydrogen gas blown on the exposed portion of the surface of semiconductor layer 12 is in the range 1 standard cubic centimeters to 100 standard cubic centimeters however, is not limited to this range. The gaseous hydrogen reacts with the surface oxides on the surface of the Group III-V semiconductor material (e.g., semiconductor layer 12) creating $H_2O$ which is pumped out of the chamber. The surface modification treatment removes oxides from the surface of semiconductor layer 12. The surface modification treatment typically occurs at temperatures in the range of 200° Celsius to 650° Celsius, although other temperatures may be used. In various embodiments, when surface modification treatment is complete, device structure 100a remains in an oxygen free environment to prevent surface oxide re-growth on the exposed surface of semiconductor layer 12. For example, semiconductor device 100a stays in the ultra-high vacuum chamber.

In another embodiment, the surface modification treatment is used for surface oxide removal on other semiconductor materials. For example, the surface modification treatment may be used on Si, Group IV semiconductor materials, or Group II-VI semiconductor materials. In an embodiment, the surface modification treatment is used with other processes. For example, the surface modification treatment may be used to remove oxides prior to epitaxy growth including vapor-phase or liquid phase, dopant deposit and high temperature processes, metal layer deposition (CVD, PVD, ALD, etc) or other semiconductor processes.

In step 806, in-situ selective solid-phase epitaxy is used for dopant deposition. Dopant layer 21, as depicted in FIG. 2, is grown using an in-situ solid-phase epitaxial growth process. A selective, low temperature epitaxial growth of solid source dopants occurs on the exposed surface of semiconductor layer 12. In an embodiment, an oxide or nitride layer may be used to define selective epitaxial growth areas. In the exemplary embodiment, a deposition process in an oxygen free environment is used to deposit a layer of dopant material (e.g., dopant layer 21) on the exposed surface of semiconductor layer 12. For example, an ultra-high vacuum (UHV) CVD process may deposit a thin layer of amorphous or crystalline silicon on a Group III-V semiconductor material such as InGaAs or GaAs. Ultra-high vacuum pressure may be in the range of $10^{-4}$ TORR to $10^{-10}$ TORR. Other deposition processed such as ALD, PVD, or PECVD may be used for dopant deposition. Similarly, other dopants for Group III-V semiconductors such as Sn, Ge, SiGe and GeSn, for example, may be used as dopants for nFET devices. Low temperature solid-phase epitaxy occurs at temperatures in the range of 150° Celsius to 650° Celsius. The thickness of the deposited dopant material of dopant layer 21 is in the range of 0.1 nm to 20 nm. In an embodiment, the thickness of the deposited dopant material may be greater than 20 nm.

In step 808, a low temperature anneal is performed. In the exemplary embodiment, the dopant material is diffused into the upper surface region of semiconductor layer 12 using a low temperature process to form region 32, as depicted in FIG. 3. For example, a low temperature hydrogen plasma anneal may be used to drive a Si dopant material into semiconductor layer 12 composed of InGaAs. In an embodiment, region 32, composed of semiconductor layer 12 and a dopant, has a dopant concentration determined by the specific materials (e.g., semiconductor material and dopant material) and desired electrical performance of the semiconductor device. For example, the dopant concentration for Si in an InGaAs semiconductor layer may have a desired dopant concentration in the range of $10^{19}$ atoms/cm$^3$ for an application as determined by semiconductor device modelling.

In the exemplary embodiment, low temperatures are used for annealing an n-type dopant with a Group III-V semiconductor material. For examples, temperatures in the range 200° Celsius to 650° Celsius are used for a low temperature anneal of a Group III-V semiconductor material with an n-type dopant. The diffused dopant material from dopant layer 21 such as silicon in semiconductor layer 12 forms region 32. In an embodiment, region 32 forms a portion of the source and the drain for a semiconductor device. The oxide-free surface semiconductor surface provided by the surface modification treatment of semiconductor layer 12 (discussed above in step 804) allows effective diffusion or movement of dopant materials into semiconductor layer 12 during low temperature anneal process.

In step 810, a metal layer is formed on the dopant layer. A thin layer of metal layer 44, depicted in FIG. 4, is deposited by known silicide deposition processes on the exposed surface of semiconductor layer 12. Metal layer 44 may be composed of silicide materials or transitional metals such as Ni, NiPt, Co, Ti, Pd, Au, Mo, or Sn, but, is not limited to these materials. Metal layer 44 may be deposited on the active device areas composed of semiconductor material doped with an n-type dopant. In an embodiment, metal layer 44 is composed of a material used for silicide or metallic alloy formation on a Group III-V semiconductor material. For example, nickel (e.g., metal layer 44) may be deposited on region 32 of semiconductor layer 12 composed of InGaAs and Si. In the exemplary embodiment, thickness of metal layer 44 may be 2 nm to 50 nm. In one embodiment, thickness of metal layer 44 may be less than 2 nm. In various embodiments, deposition of metal layer 44 occurs in an oxygen free environment. For example, a ultra-high pressure vacuum chamber, a nitrogen or a hydrogen environment may be used for metal layer 44 deposit.

In step 812, a low temperature alloying occurs. In the exemplary embodiment, a low temperature alloying process occurs at temperatures ranging from 150° Celsius and 650° Celsius. Metal layer 44 alloys or combines with the dopant material in dopant layer 21 to form alloy layer 51, as depicted in FIG. 5. For example, metal layer 44 may be Ni deposited on dopant layer 21 composed of solid-phase epitaxially grown Si which combine to form alloy layer 51 composed of Ni—Si (e.g., a Ni silicide). Metal layer 44 consumes or utilizes the dopant material in dopant layer 21 when forming alloy layer 51 thus, leaving a low resistance, oxide-free junction between alloy layer 51 and semiconductor layer 12. The low temperature alloying of metal layer 44 and dopant layer 21 consumes or combines dopant layer 21 to form alloy layer 51 without leaving dopant layer 21 present on top of region 32 in semiconductor layer 12. Upon completion of the low temperature alloying, semiconductor layer 12 has a region 32 with a dopant material and alloy layer 51 on top of region 32 forming a low resistance junction for the semiconductor device with little to no oxides present. In one embodiment, the alloying processes of the metal layer 44 with the dopant of dopant layer 21 consumes all of the dopant material in the semiconductor junction. For example, no layer of dopant material (e.g., dopant layer 21) is present under alloy layer 51 between alloy layer 51 and region 32 in semiconductor layer 12. In various embodiments, alloy layer 51 and region 32 form a junction for an active device element such as a source or a drain. In one embodiment, alloy layer 51 and region 32 may form a raised source or drain for a semiconductor device. Additionally, the creation of alloy layer 51 and region 32 on semiconductor layer 12 is performed with low temperature processes (e.g., 650° Celsius or below) thus, without degrading the structure or composition of the Group III-V semiconductor material used in semiconductor layer 12.

While the steps discussed in FIGS. 1-5 and FIG. 8 provide a method to form a semiconductor junction, as known to one skilled in the art, the step and methods discussed above may be used in the manufacture of other elements or features of a semiconductor device or in the manufacture of a semiconductor wafer.

In some embodiments, the wafers formed by the embodiments of the present invention may be diced in semiconductor chip form. The resulting integrated circuit chips can be distributed by the fabricator in raw wafer form (that is, as a single wafer that has multiple unpackaged chips), as a bare die or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard or (b) an end product. The end product can be any product that includes integrated circuit chips, ranging from toys and other low-end applications to advanced computer products having a display, a keyboard or other input device and a central processor.

What is claimed is:

1. A method of forming a dopant junction in a semiconductor device, the method comprising:
    performing a surface modification treatment on an exposed surface of a semiconductor layer;
    depositing an n-type dopant material for a Group III-V semiconductor material on the exposed surface of the semiconductor layer;
    performing a low temperature anneal in an oxygen free environment in order to drive the dopant material into the semiconductor layer;
    depositing a metal layer on the dopant material; and
    alloying the metal layer with the dopant material to form a semiconductor device junction; wherein:
    the semiconductor layer is composed of a Group III-V semiconductor material;
    the surface modification treatment occurs in a low pressure vacuum chamber and wherein the surface modification treatment includes applying a low velocity stream of gaseous hydrogen to the exposed surface of the semiconductor layer in order for oxygen desorption to occur to form a water vapor, which thereby removes a plurality of surface oxides from the exposed surface of the semiconductor layer in order to provide an oxide-free surface for material adhesion, and wherein after the surface modification treatment, the semiconductor device remains in the oxygen free environment; and
    each of the above processes occur at a low temperature.

2. The method of claim 1, wherein the low temperature at which each of the processes occur is a temperature less than or equal to 650° Celsius.

3. The method of claim 1, wherein the surface modification treatment is performed at $10^{-4}$ TORR to $10^{-10}$ TORR.

4. The method of claim 1, wherein depositing the dopant material is done by a selective epitaxial growth of the dopant material.

5. The method of claim 1, wherein depositing the n-type dopant material is depositing the n-type dopant material composed of at least one of: Ge, SiGe, GeSn, Sn, SiC, SiGeC, GeC, and InP.

6. The method of claim 1, wherein the low temperature anneal occurs in a hydrogen plasma.

7. The method of claim 1, wherein the low temperature anneal forms a region in the semiconductor layer under the dopant material, and wherein the region is composed of the semiconductor material and a portion of the dopant material.

8. The method of claim 1, wherein alloying the metal layer with the dopant material consumes the dopant layer.

9. The method of claim 1, wherein after alloying the metal layer with the dopant material, the exposed surface of the semiconductor layer where the dopant material was deposited is oxide free.

10. A semiconductor structure with a dopant junction in a semiconductor device, comprising:
    a Group III-V semiconductor layer, wherein a surface modification treatment is performed on an exposed surface of the semiconductor layer in an oxygen free environment, and wherein the surface modification treatment occurs in a low pressure vacuum chamber and includes applying a low velocity stream of gaseous hydrogen to the exposed surface of the semiconductor layer in order for oxygen desorption to occur to form a water vapor, thereby removing a plurality of surface oxides from the exposed surface of the semiconductor layer;
    a region in the Group III-V semiconductor layer with an n-type dopant material for a Group III-V semiconductor material forming the dopant junction; and
    an alloy layer composed of a metal and the dopant material, wherein the alloy layer is over the region in the Group III-V semiconductor layer with the dopant material.

11. The semiconductor structure of claim 10, wherein the Group III-V semiconductor layer is at least one of: InGaAs, InP and GaAs.

12. The semiconductor structure of claim 10, wherein a dopant layer is not present between the alloy layer and the region in the Group III-V semiconductor layer with the n-type dopant material.

13. The semiconductor structure of claim 10, wherein the n-type dopant material is Si.

14. The semiconductor structure of claim 10, wherein the n-type dopant material is at least one of: Ge, SiGe, GeSn, Sn, SiC, SiGeC, GeC, and InP.

15. The semiconductor structure of claim 10, wherein the alloy layer is an alloy of a transitional metal and the n-type dopant material for the Group III-V semiconductor material.

16. The semiconductor structure of claim 10, wherein the alloy layer is an alloy of Ni and Si.

* * * * *